(12) United States Patent
Chen et al.

(10) Patent No.: US 12,438,084 B2
(45) Date of Patent: Oct. 7, 2025

(54) DUAL-METAL ULTRA THICK METAL (UTM) STRUCTURE

(71) Applicant: INTERNATIONAL BUSINESS MACHINES CORPORATION, Armonk, NY (US)

(72) Inventors: Hsueh-Chung Chen, Cohoes, NY (US); Yann Mignot, Slingerlands, NY (US); Chi-Chun Liu, Altamont, NY (US); Mary Claire Silvestre, Clifton Park, NY (US); Jennifer Oakley, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 785 days.

(21) Appl. No.: 17/548,773

(22) Filed: Dec. 13, 2021

(65) Prior Publication Data
US 2023/0187350 A1    Jun. 15, 2023

(51) Int. Cl.
*H01L 23/528* (2006.01)
*H01L 21/768* (2006.01)
*H01L 23/522* (2006.01)
*H01L 23/532* (2006.01)

(52) U.S. Cl.
CPC .... *H01L 23/5283* (2013.01); *H01L 21/76877* (2013.01); *H01L 23/53238* (2013.01)

(58) Field of Classification Search
CPC ......... H01L 21/76885; H01L 21/76883; H01L 21/76834; H01L 23/5226; H01L 23/53242; H01L 23/53238; H01L 21/76877
See application file for complete search history.

(56) References Cited

U.S. PATENT DOCUMENTS

| | | | |
|---|---|---|---|
| 5,521,440 A | | 5/1996 | Iranmanesh et al. |
| 5,534,462 A | * | 7/1996 | Fiordalice ......... H01L 21/76829 257/E21.585 |
| 5,567,982 A | * | 10/1996 | Bartelink ............ H01L 23/5222 257/664 |
| 5,602,053 A | * | 2/1997 | Zheng ............... H01L 21/76807 257/355 |
| 5,880,018 A | * | 3/1999 | Boeck ............... H01L 21/76885 257/E21.589 |

(Continued)

FOREIGN PATENT DOCUMENTS

CN           1168739 A       12/1997

OTHER PUBLICATIONS

International Search Report from PCT/CN2022/127040 dated Dec. 15, 2022. (9 pages).

*Primary Examiner* — Mohsen Ahmadi
(74) *Attorney, Agent, or Firm* — Tutunjian & Bitetto, P.C.; L. Jeffrey Kelly

(57) ABSTRACT

A semiconductor device includes a conductive line disposed within a dielectric layer, a metal layer disposed over and in direct contact with the conductive line, and a metallization layer disposed over the metal layer such that a protruding segment of the metal layer acts as an interface between the conductive line and the metallization layer. The conductive line is copper (Cu) and the metal layer is ruthenium (Ru). The Ru metal layer includes an upper metal layer section and a lower metal layer section.

19 Claims, 7 Drawing Sheets

(56) References Cited

U.S. PATENT DOCUMENTS

| | | | | |
|---|---|---|---|---|
| 5,969,422 A * | 10/1999 | Ting | H01L 21/76846 | 257/769 |
| 5,969,425 A * | 10/1999 | Chen | H01L 21/76852 | 257/E21.585 |
| 6,066,560 A * | 5/2000 | Yakura | H01L 23/53238 | 438/643 |
| 6,242,340 B1 * | 6/2001 | Lee | H01L 21/76844 | 438/634 |
| 6,285,082 B1 * | 9/2001 | Joshi | H01L 21/76877 | 257/750 |
| 6,303,486 B1 * | 10/2001 | Park | H01L 23/53238 | 438/638 |
| 6,420,725 B1 * | 7/2002 | Harshfield | H10N 70/011 | 257/E21.585 |
| 6,521,542 B1 | 2/2003 | Armacost et al. | | |
| 7,071,099 B1 | 7/2006 | Greco et al. | | |
| 7,071,557 B2 * | 7/2006 | Akram | H01L 21/76844 | 257/773 |
| 7,514,354 B2 | 4/2009 | Park et al. | | |
| 8,586,473 B1 | 11/2013 | Tanwar et al. | | |
| 8,940,635 B1 | 1/2015 | Chi et al. | | |
| 10,115,670 B2 | 10/2018 | Edelstein et al. | | |
| 10,157,784 B2 | 12/2018 | Yu et al. | | |
| 10,269,698 B1 | 4/2019 | Reznicek et al. | | |
| 11,705,395 B2 * | 7/2023 | Lin | H01L 21/76816 | 257/751 |
| 2008/0197500 A1 | 8/2008 | Yang et al. | | |
| 2012/0141667 A1 | 6/2012 | Kim et al. | | |
| 2016/0314985 A1 | 10/2016 | Yang et al. | | |
| 2021/0013097 A1 | 1/2021 | Li et al. | | |
| 2021/0050259 A1 | 2/2021 | Xie et al. | | |
| 2021/0082751 A1 | 3/2021 | Yang et al. | | |
| 2021/0296171 A1 | 9/2021 | Anderson et al. | | |
| 2021/0305152 A1 | 9/2021 | Dechene et al. | | |
| 2023/0005836 A1 * | 1/2023 | Zhu | H01L 23/5226 | |

* cited by examiner

DUAL-METAL ULTRA THICK METAL (UTM) STRUCTURE

BACKGROUND

The present invention relates generally to semiconductor devices, and more specifically, to a dual-metal ultra thick metal (UTM) structure.

The semiconductor integrated circuit (IC) industry has produced a wide variety of devices to address issues in a number of different areas, including radio frequency (RF) communications. While growing in popularity, improving RF integrated circuits puts particular demands on the semiconductor process. Some RF circuits employ thick metal layers, even ultra thick metal layers (UTMs) for inductive and other properties. However, some traditional semiconductor processing techniques do not readily scale for use with UTM.

SUMMARY

In accordance with an embodiment, a semiconductor device is provided. The semiconductor device includes a conductive line disposed within a dielectric layer, a metal layer disposed over and in direct contact with the conductive line, and a metallization layer disposed over the metal layer such that a protruding segment of the metal layer acts as an interface between the conductive line and the metallization layer.

In accordance with another embodiment, a semiconductor device is provided. The semiconductor device includes a conductive line disposed within a dielectric layer, a first metal layer disposed over and in direct contact with the conductive line, a second metal layer disposed over and in direct contact with the first metal layer, and a metallization layer disposed over the second metal layer such that a protruding segment of the second metal layer acts as an interface between the conductive line and the metallization layer.

In accordance with yet another embodiment, a method for forming a semiconductor device is provided. The method includes forming a conductive line within a dielectric layer, constructing a first metal layer over and in direct contact with the conductive line, constructing a second metal layer over and in direct contact with the first metal layer, and forming a metallization layer over the second metal layer such that a protruding segment of the second metal layer acts as an interface between the conductive line and the metallization layer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing a dual-metal ultra thick metal (UTM) structure for preventing the via-to-line delamination observed during module thermal cycle stress by eliminating the via-metal interface.

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring, e.g., interconnect, structures.

Within dual damascene interconnect structures, electrically conductive metal vias run perpendicular to the semiconductor substrate and electrically conductive metal lines run parallel to the semiconductor substrate. Usually, the electrically conductive metal vias are present beneath the electrically conductive metal lines and both features are embedded within an interconnect dielectric material layer.

In conventional dual damascene interconnect structures, copper or a copper containing alloy has been used as the material of the electrically conductive metal vias and lines. In recent years, advanced dual damascene interconnect structures including a combined electrically conductive via/line feature have been developed in which an alternative metal such as cobalt or ruthenium is used as a liner in conjunction with, copper or a copper alloy. In such cases, copper voids are usually formed in the via and line portions of the damascene interconnect structure and the copper grain size is often small (e.g., less than 5 nm). However, such advanced dual damascene interconnect structure may exhibit delamination at the via landing on the first ultra thick metal (UTM).

The exemplary embodiments of the present invention prevent via-to-line delamination observed during module thermal cycle stress by eliminating the via-metal interface and replacing copper with ruthenium or cobalt/ruthenium, which both have stronger mechanical properties than the interface of the copper liner (under the via-to-copper below).

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
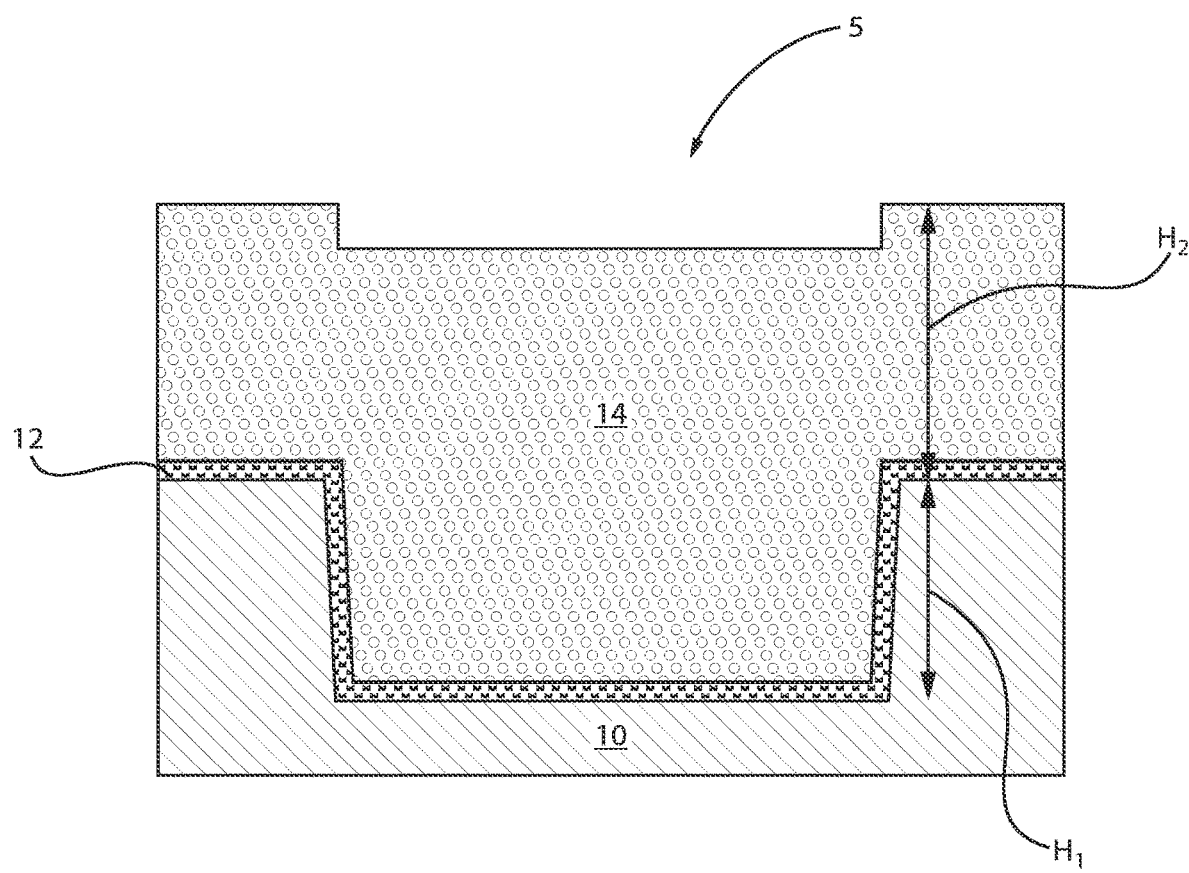
FIG. 1 is a cross-sectional view of a semiconductor structure including a conductive material formed over a dielectric layer, in accordance with an embodiment of the present invention.

FIG. 1 is a cross-sectional view of a semiconductor structure including a conductive material formed over a dielectric layer, in accordance with an embodiment of the present invention.

In various exemplary embodiments, a structure 5 includes a conductive material 14 formed over and within a trench of an inter-layer dielectric (ILD) 10. A metal liner 12 can be formed or deposited around the trench of the ILD 10.

A height of the conductive material 14 within the trench is designated as $H_1$ and a height of the conductive material 14 outside the trench is designated as $H_2$. In one example, $H_1$ is about 3 µm and $H_2$ is about 4 µm.

The ILD 10 can include any materials known in the art, such as, for example, porous silicates, carbon doped oxides, silicon dioxides, silicon nitrides, silicon oxynitrides, or other dielectric materials. The ILD 10 can be formed using any method known in the art, such as, for example, chemical vapor deposition, plasma enhanced chemical vapor deposition, atomic layer deposition, or physical vapor deposition. The ILD 10 can have a thickness ranging from about 25 nm to about 200 nm.

The ILD 10 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

Non-limiting examples of the conductive material 14 include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material 14 can further include dopants that are incorporated during or after deposition. The conductive material 14 can be deposited by a suitable deposition process, for example, CVD, PECVD, PVD, plating, thermal or e-beam evaporation, and sputtering.

The metal liner 12 can be metals, such as, for example, tantalum nitride and tantalum (TaN/Ta), titanium, titanium nitride, cobalt, ruthenium, and manganese.

In one example, the metal liner 12 can be a tantalum nitride (TaN) liner or in the alternative a tantalum (Ta) liner. In one example embodiment, the metal liner 12 can be deposited, for example, by electroplating, electroless plating, chemical vapor deposition (CVD), atomic layer deposition (ALD) and/or physical vapor deposition (PVD).

Figure 2:
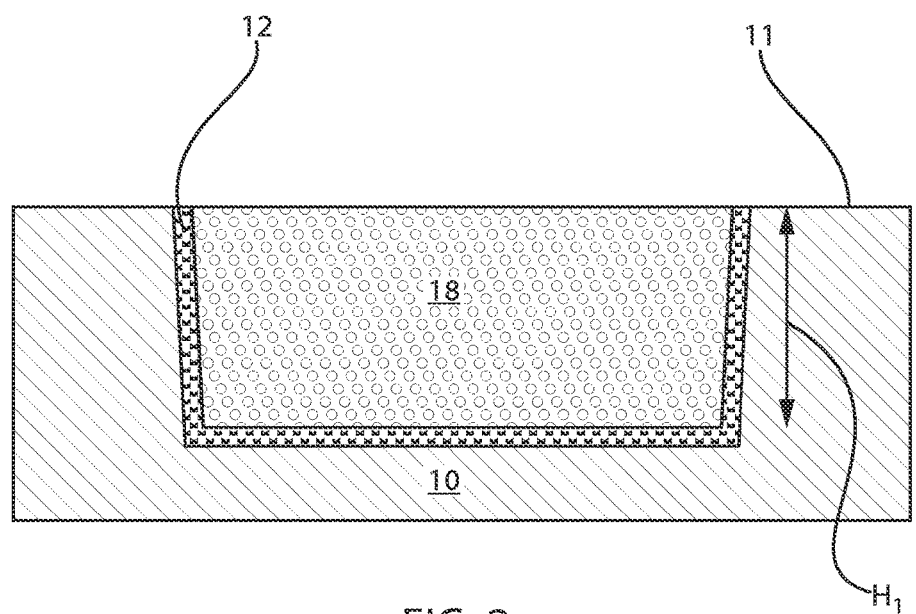
FIG. 2 is a cross-sectional view of the semiconductor structure of FIG. 1 where the conductive material is planarized to define a conductive line within the dielectric layer, in accordance with an embodiment of the present invention.

FIG. 2 is a cross-sectional view of the semiconductor structure of FIG. 1 where the conductive material is planarized to define a conductive line within the dielectric layer, in accordance with an embodiment of the present invention.

In various exemplary embodiments, the conductive material 14 is planarized by, e.g., chemical-mechanical polishing (CMP), to define a conductive line 18 within the trench of the ILD 10. A top surface 11 of the ILD 10 is flush with the top surface of the conductive line 18.

The conductive line 18 can be any conductive material known in the art, such as, for example, copper (Cu), aluminum (Al), or tungsten (W).

The etch can, for example, include a wet etch such as a phosphoric acid ($H_3PO_4$) (wet chemistry) etch or a diluted hydrogen fluoride (HF) etch.

Figure 3:
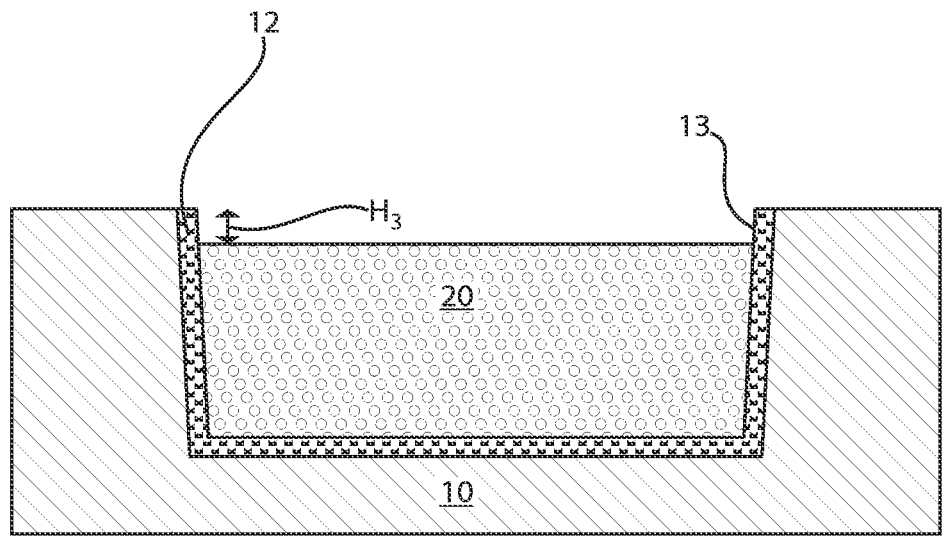
FIG. 3 is a cross-sectional view of the semiconductor structure of FIG. 2 where the conductive line is recessed, in accordance with an embodiment of the present invention.

FIG. 3 is a cross-sectional view of the semiconductor structure of FIG. 2 where the conductive line is recessed, in accordance with an embodiment of the present invention.

In various exemplary embodiments, the conductive line 18 is recessed such that a recessed conductive line 20 remains. The upper sidewalls 13 of the metal liner 12 are exposed. The conductive line 18 can be recessed by a height $H_3$. $H_3$ can be about 0.05-1 µm.

Figure 4:
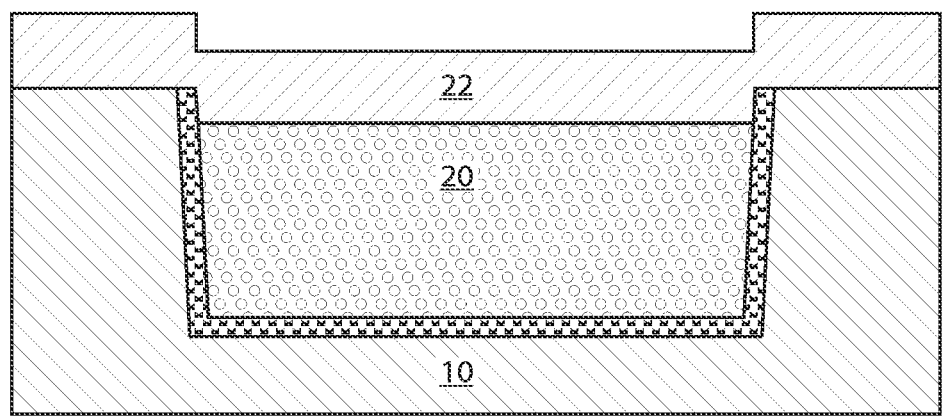
FIG. 4 is a cross-sectional view of the semiconductor structure of FIG. 3 where a metal layer is formed over the conductive line, in accordance with an embodiment of the present invention.

FIG. 4 is a cross-sectional view of the semiconductor structure of FIG. 3 where a metal layer is formed over the conductive line, in accordance with an embodiment of the present invention.

In various exemplary embodiments, a metal layer 22 is formed over the recessed conductive line 20. The metal layer 22 also extends over the ILD 10.

In one example, the metal layer 22 can be, e.g., ruthenium (Ru).

Regarding the ruthenium employed in the exemplary embodiments, ruthenium is a transition metal, which means that ruthenium has an incomplete inner shell that serves as a link between the least and the most electropositive in a series of elements. Like the other members of the platinum family (platinum, rhodium, palladium, iridium, osmium), ruthenium is inert, which means Ru will not react when exposed to most chemicals. Ruthenium is extremely hard. It is often used as a hardener for platinum and palladium. Ruthenium also will not tarnish at room temperature, and small amounts of the material can enhance the corrosion resistance of titanium. Ruthenium's hardness makes it an excellent choice for increasing the wear resistance of electrical contacts and resistors, especially when alloyed with other platinum group metals. Ruthenium plating is also used when manufacturing semiconductors.

Ruthenium has drawn substantial interest because Ru can serve as both barrier and seed layers, minimizing the amount of high resistance material needed in semiconductor circuits. As linewidths shrink below 15 nm, though, even a 1 or 2 nanometer barrier layer may be too much. As line volume shrinks, the resistance of Cu rises sharply due to electron scattering from sidewalls and grain boundaries. Increasing resistance adds to overall circuit delays and also contributes to electromigration. As a refractory metal, ruthenium has a very high melting point (above 2300° C.) and good electromigration resistance. Therefore, the use of ruthenium provides advantageous unexpected results, as the stripping of a titanium nitride (TiN) layer does not affect (e.g., etch) the ruthenium layer during processing.

Figure 5:
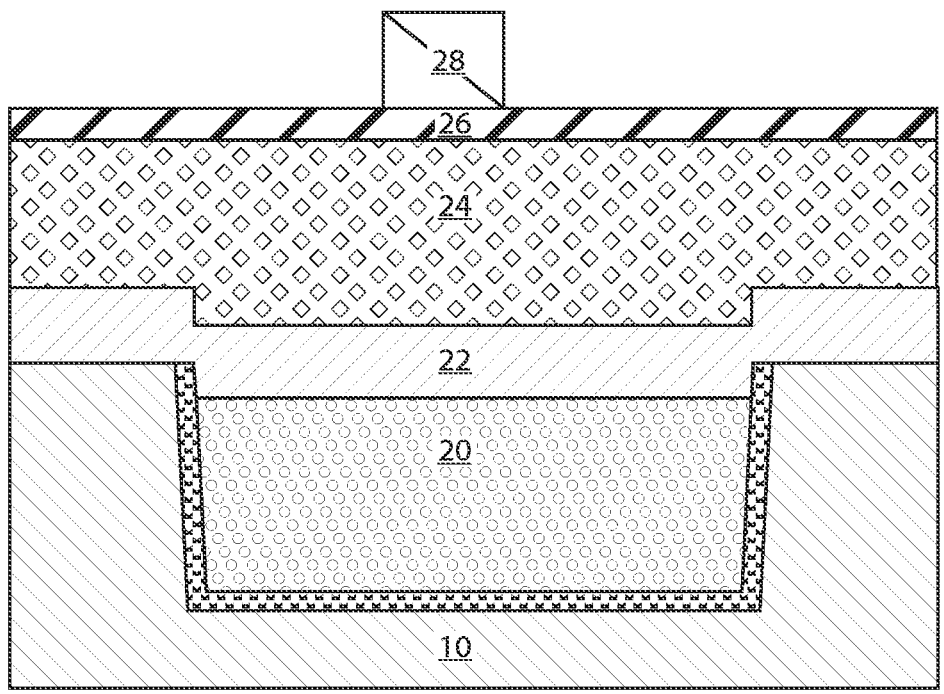
FIG. 5 is a cross-sectional view of the semiconductor structure of FIG. 4 where a lithography stack is deposited, in accordance with an embodiment of the present invention.

FIG. 5 is a cross-sectional view of the semiconductor structure of FIG. 4 where a lithography stack is deposited, in accordance with an embodiment of the present invention.

In various exemplary embodiments, a lithography stack is deposited.

The lithographic stack includes an organic planarization layer (OPL) 24, an antireflective hard mask layer 26, and a photoresist layer 28.

The OPL 24 can include an organic planarization material, which is a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the OPL 24 forms a planar horizontal surface. Exemplary organic planarization materials include, but are not limited to, near-frictionless carbon (NFC) material, diamond-like carbon, polyarylene ether, and polyimide. The OPL 24 can be deposited, for example, by spin coating. The thickness of the OPL 24 can be from about 100 nm to about 500 nm, although lesser and greater thicknesses can also be employed.

The antireflective hard mask layer 26 is formed on the OPL 24. The antireflective hard mask layer 26 can include an antireflective coating material. The antireflective hard mask layer 26 is employed in the lithographic process to improve the photoresist profile and to reduce the line width variation caused by scattering and reflecting light. The antireflective hard mask layer 26 can include a silicon-containing antireflective coating (SiARC) material, a titanium-containing antireflective coating material (TiARC), silicon nitride, silicon oxide or TiN. In one embodiment, the antireflective hard mask layer 26 includes a SiARC material. The antireflective hard mask layer 26 can be applied, for example, by spin coating or CVD. The thickness of the antireflective hard mask layer 26 can be from about 10 nm to about 150 nm, although lesser and greater thicknesses can also be employed.

The photoresist layer 28 is deposited as a blanket layer atop the antireflective hard mask layer 26, for example, by spin coating. The photoresist layer 28 can include any organic photoresist material such as, for example, methacrylates or polyesters. The photoresist layer 28 can have a thickness from about 30 nm to about 500 nm, although lesser and greater thicknesses can also be employed. In one instance, the thickness of the photoresist layer 28 is 360 nm.

Figure 6:
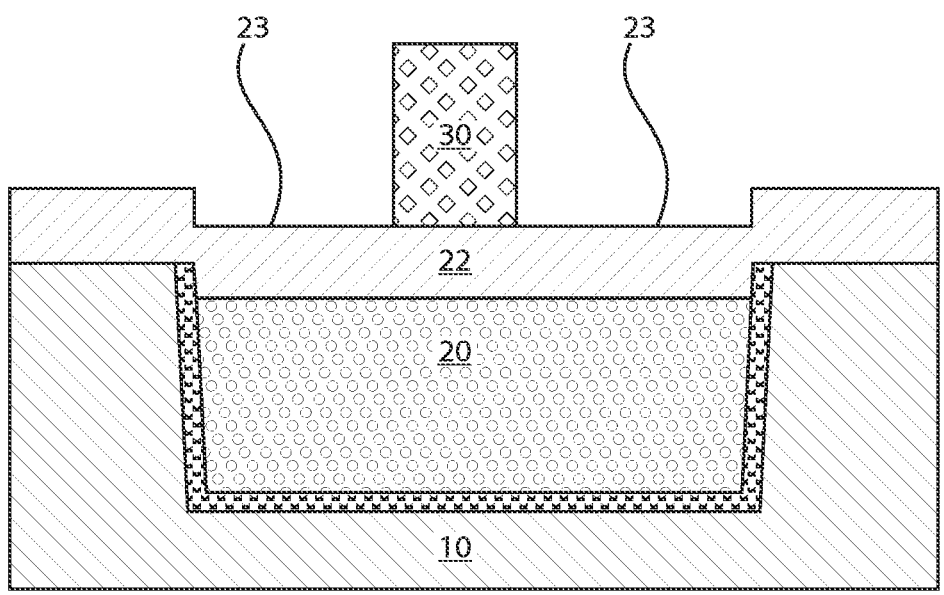
FIG. 6 is a cross-sectional view of the semiconductor structure of FIG. 5 where the lithography stack is patterned, in accordance with an embodiment of the present invention.

FIG. 6 is a cross-sectional view of the semiconductor structure of FIG. 5 where the lithography stack is patterned, in accordance with an embodiment of the present invention.

In various exemplary embodiments, the lithography stack is patterned such that an OPL portion 30 remains over a portion of the metal layer 22. A top surface 23 of the metal layer 22 is further exposed.

Figure 7:
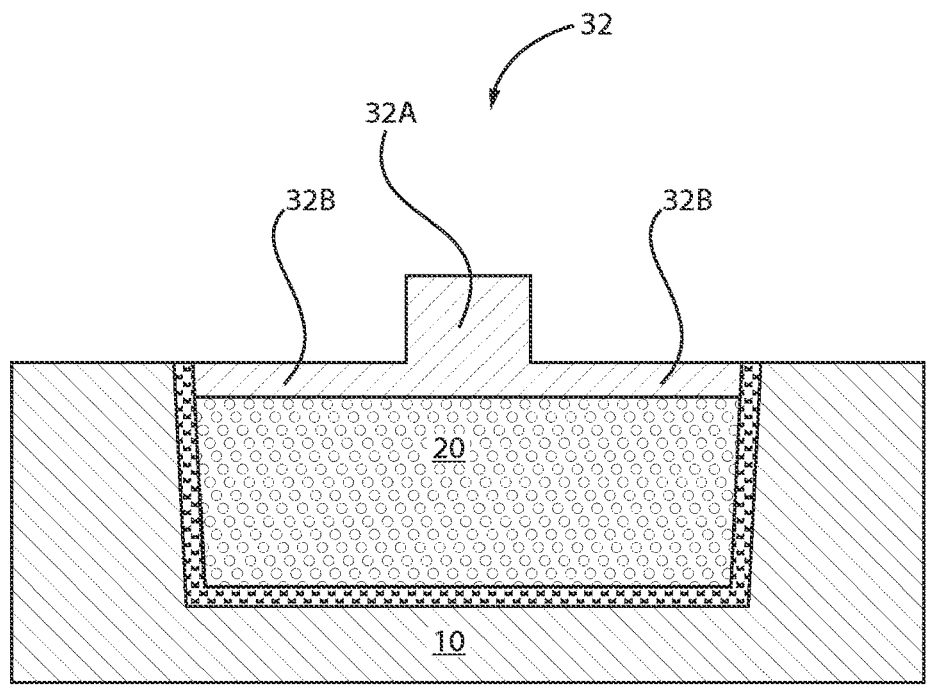
FIG. 7 is a cross-sectional view of the semiconductor structure of FIG. 6 where the metal layer is etched, in accordance with an embodiment of the present invention.

FIG. 7 is a cross-sectional view of the semiconductor structure of FIG. 6 where the metal layer is etched, in accordance with an embodiment of the present invention.

In various exemplary embodiments, the metal layer 22 is etched such that a metal layer section 32 remains. The metal layer section 32 includes an upper metal layer section 32A and a lower metal layer section 32B. The upper metal layer section 32A can be referred to as a protruding segment. The recessed conductive line 20 and the metal layer section 32 are part of the first metallization level. Thus, the upper metal layer section 32A of the metal layer section 32 acts as an interface between the recessed conductive line 20 and the second metallization layer (FIG. 8).

The lower metal layer section 32B directly contacts an entirety of an upper surface of the recessed conductive line 20.

A collective height of the recessed conductive line 20 and the lower metal layer section 32B is greater than 1.5 µm.

Figure 8:
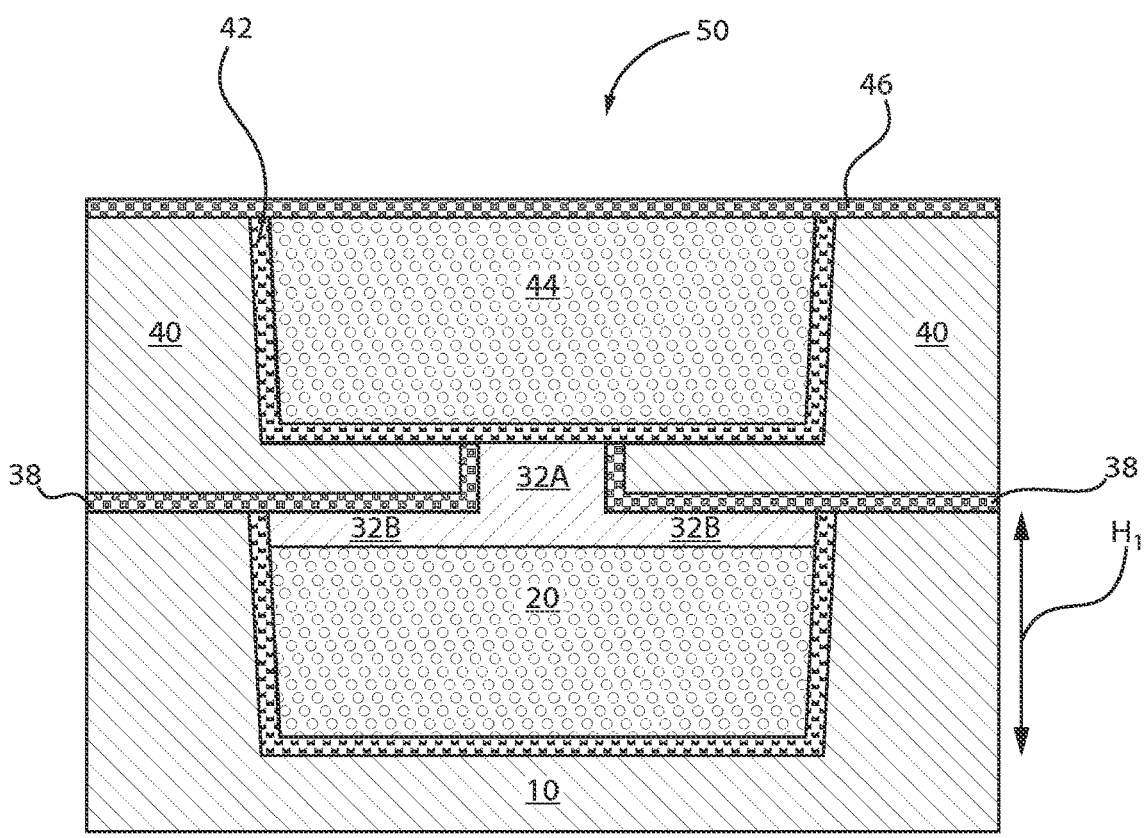
FIG. 8 is a cross-sectional view of the semiconductor structure of FIG. 7 where a second metallization layer is formed thereon, in accordance with an embodiment of the present invention.

FIG. 8 is a cross-sectional view of the semiconductor structure of FIG. 7 where a second metallization layer is formed thereon, in accordance with an embodiment of the present invention.

In various exemplary embodiments, a second metallization layer is formed thereon.

In particular, a capping layer 38 is formed over the metal layer section 32. An ILD 40 is then formed thereon. A trench is formed in the ILD 40, another metal liner 42 is deposited, and a conductive material 44 (or metal line) is formed within the trench. Another capping layer 46 is formed thereon to complete the second metallization level. The structure 50 is a bi-metal dual damascene integration structure. The via resistance can be modulated by use of redundant vias and an increase in the via critical dimensions (CD).

A thickness of the recessed conductive line 20 is less than a thickness of a conductive material 44 in the second metallization layer.

The capping layer 38 directly contacts both the upper metal layer section 32A and the lower metal layer section 32B of the metal layer section 32.

The capping layer 38 and the capping layer 46 can include nBLOK, but can be any dielectric layer which inhibits copper or ruthenium diffusion.

In FIGS. 1-8, the etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

Figure 9:
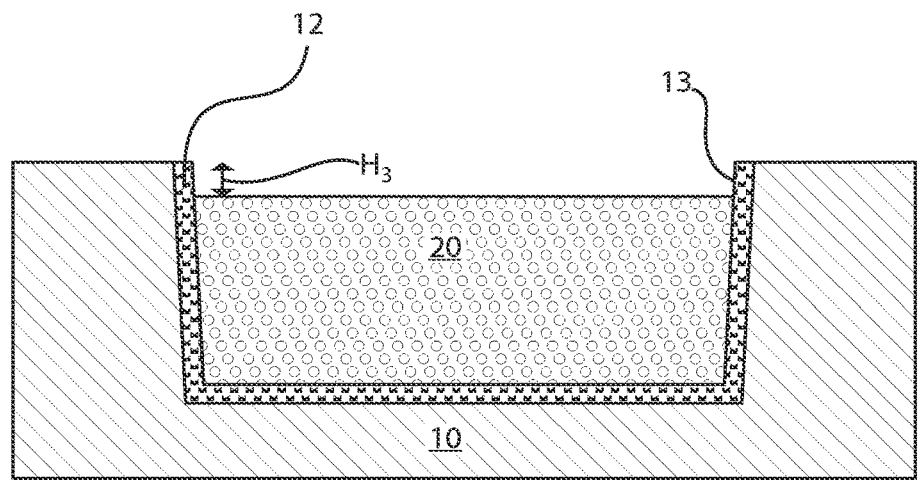
FIG. 9 is a cross-sectional view of a semiconductor structure where the conductive line is recessed, in accordance with another embodiment of the present invention.

FIG. 9 is a cross-sectional view of a semiconductor structure where the conductive line is recessed, in accordance with another embodiment of the present invention.

In various exemplary embodiments, the conductive line 18 is recessed such that a recessed conductive line 20 remains. The upper sidewalls 13 of the metal liner 12 are exposed. The conductive line 18 can be recessed by a height $H_3$. $H_3$ can be about 0.05-1 µm.

Figure 10:
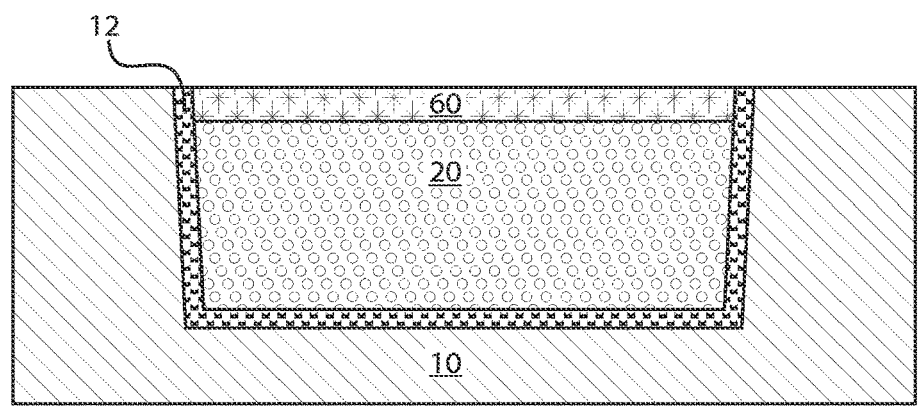
FIG. 10 is a cross-sectional view of the semiconductor structure of FIG. 9 where a first metal layer is formed over the conductive line, in accordance with an embodiment of the present invention.

FIG. 10 is a cross-sectional view of the semiconductor structure of FIG. 9 where a first metal layer is formed over the conductive line, in accordance with an embodiment of the present invention.

In various exemplary embodiments, a first metal layer 60 is formed over the recessed conductive line 20.

In one example, the first metal layer 60 can be, e.g., cobalt (Co).

Figure 11:
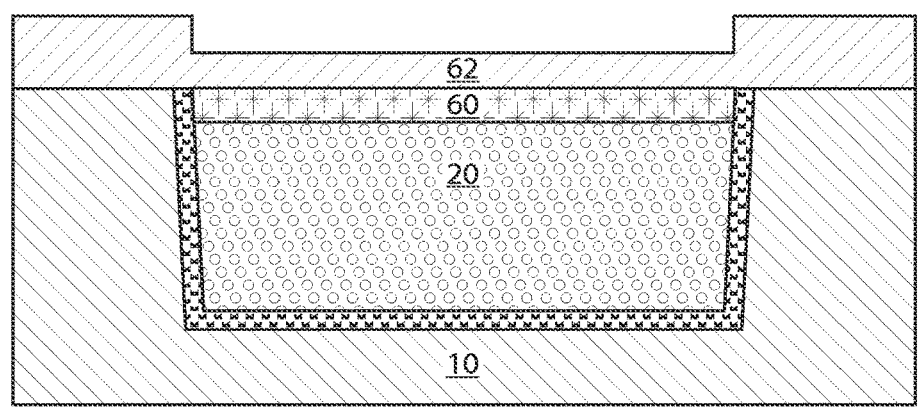
FIG. 11 is a cross-sectional view of the semiconductor structure of FIG. 10 where a second metal layer is formed over the first metal layer, in accordance with an embodiment of the present invention.

FIG. 11 is a cross-sectional view of the semiconductor structure of FIG. 10 where a second metal layer is formed over the first metal layer, in accordance with an embodiment of the present invention.

In various exemplary embodiments, a second metal layer 62 is formed over the first metal layer 60. The second metal layer 62 also extends over the ILD 10.

In one example, the second metal layer 62 can be, e.g., ruthenium (Ru).

Figure 12:
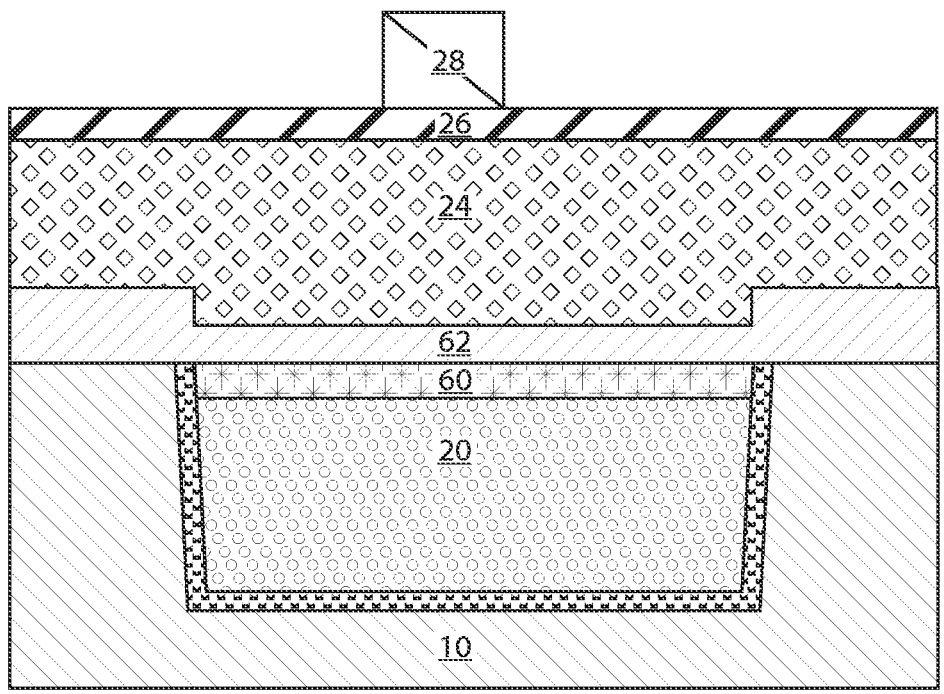
FIG. 12 is a cross-sectional view of the semiconductor structure of FIG. 11 where a lithography stack is deposited, in accordance with an embodiment of the present invention.

FIG. 12 is a cross-sectional view of the semiconductor structure of FIG. 11 where a lithography stack is deposited, in accordance with an embodiment of the present invention.

In various exemplary embodiments, a lithography stack is deposited.

The lithographic stack includes the OPL 24, the antireflective hard mask layer 26, and the photoresist layer 28 described above.

Figure 13:
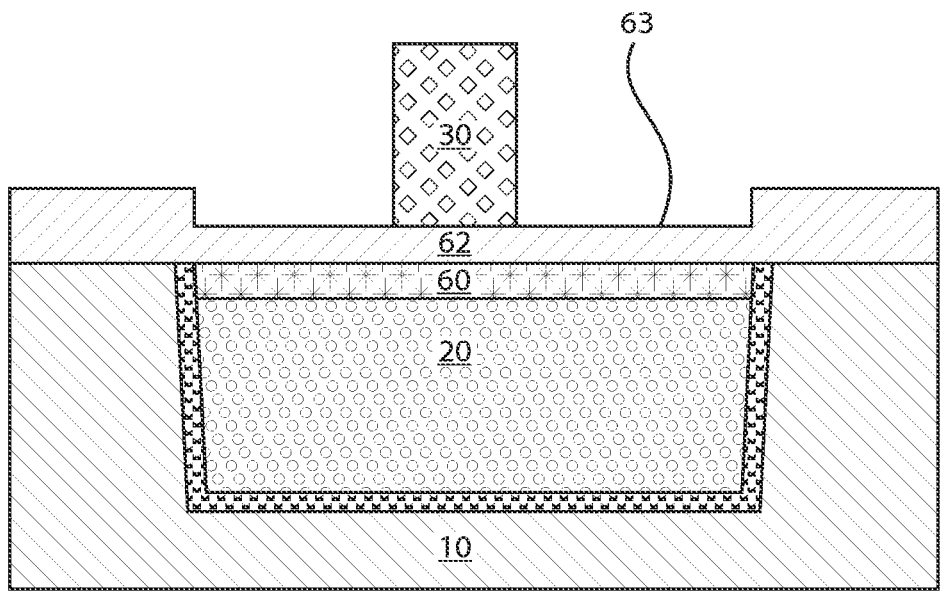
FIG. 13 is a cross-sectional view of the semiconductor structure of FIG. 12 where the lithography stack is patterned, in accordance with an embodiment of the present invention.

FIG. 13 is a cross-sectional view of the semiconductor structure of FIG. 12 where the lithography stack is patterned, in accordance with an embodiment of the present invention.

In various exemplary embodiments, the lithography stack is patterned such that an OPL portion 30 remains over a portion of the second metal layer 62. A top surface 63 of the second metal layer 62 is further exposed.

Figure 14:
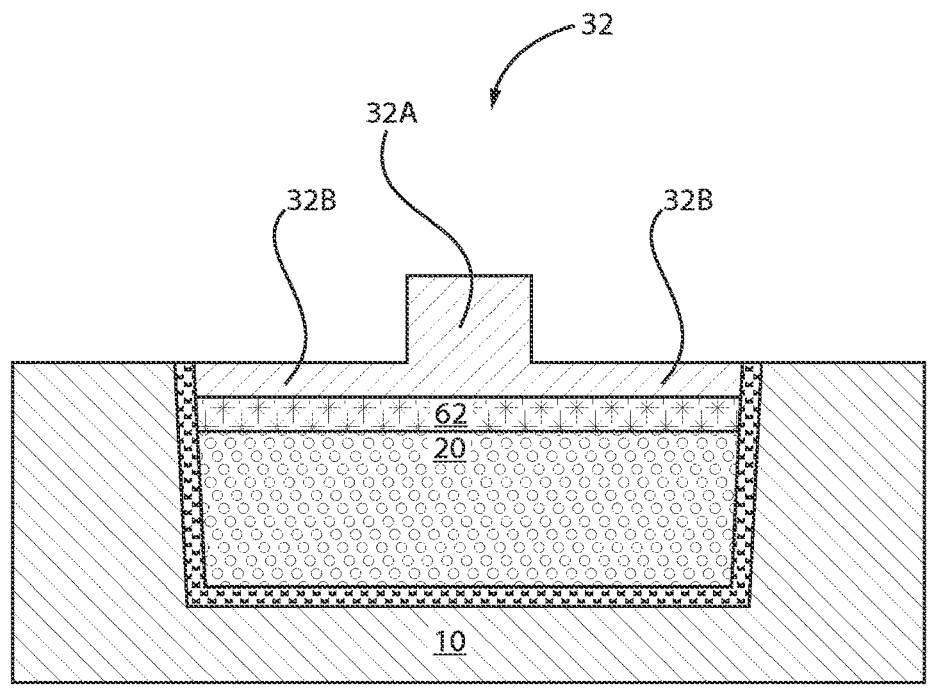
FIG. 14 is a cross-sectional view of the semiconductor structure of FIG. 13 where the second metal layer is etched, in accordance with an embodiment of the present invention.

FIG. 14 is a cross-sectional view of the semiconductor structure of FIG. 13 where the second metal layer is etched, in accordance with an embodiment of the present invention.

In various exemplary embodiments, the second metal layer 62 is etched such that a metal layer section 32 remains. The metal layer section 32 includes an upper metal layer section 32A and a lower metal layer section 32B. The upper metal layer section 32A can be referred to as a protruding segment. The recessed conductive line 20, the first metal layer 60, and the lower metal layer section 32B of the metal layer section 32 are part of the first metallization level.

Figure 15:
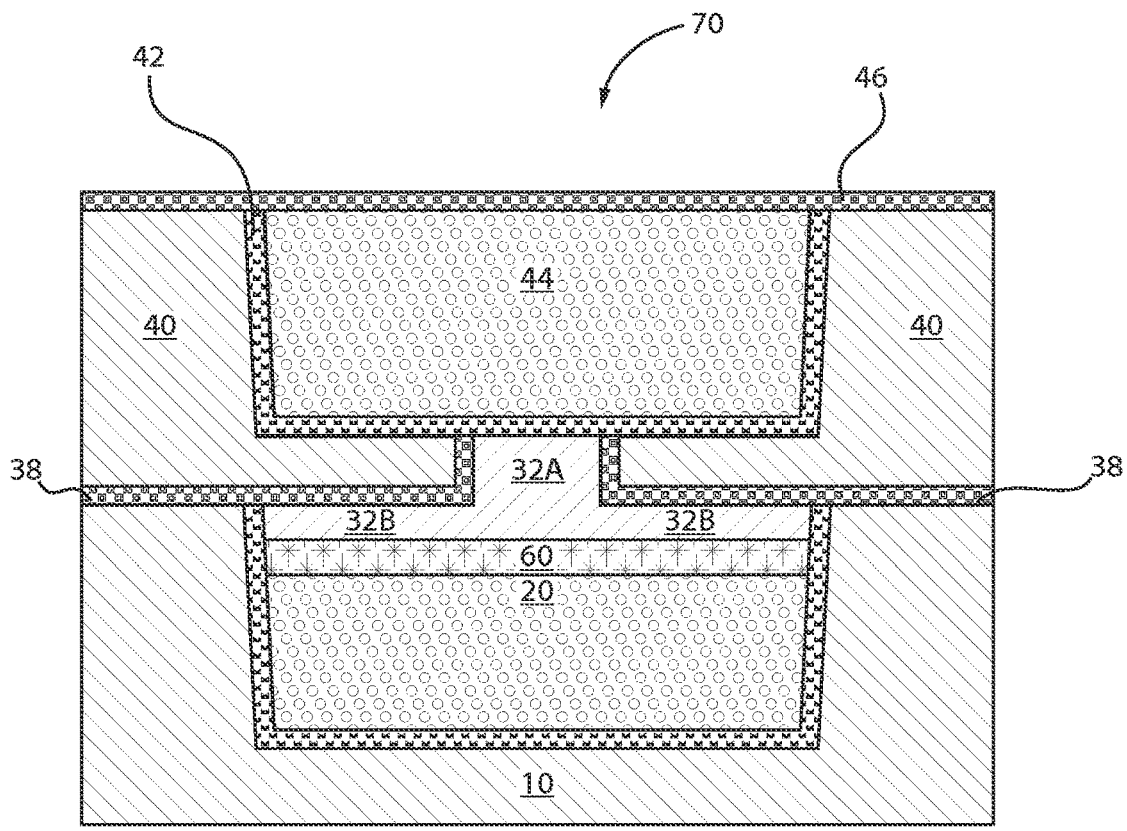
FIG. 15 is a cross-sectional view of the semiconductor structure of FIG. 14 where a second metallization layer is formed thereon, in accordance with an embodiment of the present invention.

Thus, the upper metal layer section 32A of the metal layer section 32 acts as an interface between the recessed conductive line 20 and the second metallization layer (FIG. 15).

The lower metal layer section 32B directly contacts an entirety of an upper surface of the first metal layer 60, which in turn directly contacts an entirety of an upper surface of the recessed conductive line 20.

A collective height of the recessed conductive line 20, the first metal layer 60, and the lower metal layer section 32B of the second metal layer section 32 is greater than 1.5 µm.

Etch processes which could be used in embodiments of the invention include plasma etch processes which include chemical containing fluorine or chlorine, e.g., $Cl_2$, $F_2$, $C_xF_y$, $SF_6$, $CHF_3$, $CF_xCl_y$, as well as wet etch processes using acids such as hydrogen fluoride, hydrogen chloride, sulfuric acid and nitric acid.

FIG. 15 is a cross-sectional view of the semiconductor structure of FIG. 14 where a second metallization layer is formed thereon, in accordance with an embodiment of the present invention.

In various exemplary embodiments, a second metallization layer is formed thereon.

In particular, a capping layer 38 is formed over the second metal layer section 32. An ILD 40 is then formed thereon. A trench is formed in the ILD 40, another metal liner 42 is deposited, and a conductive material 44 (or metal line) is formed within the trench. Another capping layer 46 is formed thereon to complete the second metallization level. The structure 70 is a tri-metal dual damascene integration structure. The via resistance can be modulated by use of redundant vias and an increase in the via critical dimensions (CD).

The capping layer 38 directly contacts both the upper metal layer section 32A and the lower metal layer section 32B of the second metal layer section 32.

The capping layer 38 and the capping layer 46 can include nBLOK, but can be any dielectric layer which inhibits copper or ruthenium diffusion.

Therefore, in summary the exemplary embodiments of the present invention prevent via-to-line delamination observed during module thermal cycle stress by eliminating the via-metal interface and replacing copper with ruthenium or cobalt/ruthenium, which both have stronger mechanical properties than the interface of the copper liner (under the via-to-copper below).

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

Regarding FIGS. 1-15, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments for a dual-metal ultra thick metal (UTM) structure (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device comprising:
   a conductive line disposed within a dielectric layer;
   a metal layer disposed over and in direct contact with the conductive line, wherein an entirety of a bottommost surface of the metal layer directly contacts an entirety of a topmost surface of the conductive line; and
   a metallization layer disposed over the metal layer such that a protruding segment of the metal layer acts as an interface between the conductive line and the metallization layer.

2. The semiconductor device of claim 1, wherein the conductive line is copper (Cu) and the metal layer is ruthenium (Ru).

3. The semiconductor device of claim 1, wherein the metal layer includes an upper metal layer section and a lower metal layer section.

4. The semiconductor device of claim 3, wherein the upper metal layer section prevents via-to-line delamination.

5. The semiconductor device of claim 3, wherein a collective height of the conductive line and the lower metal layer section is greater than 1.5 µm.

6. The semiconductor device of claim 3, further comprising a cap layer on a top surface of the lower metal layer section and on a side surface of the upper metal layer section.

7. The semiconductor device of claim 6, wherein an interface between the conductive line and the metal layer is below the cap layer.

8. The semiconductor device of claim 1, wherein a thickness of the conductive line is less than a thickness of a conductive material in the metallization layer.

9. A semiconductor device comprising:
   a conductive line disposed within a dielectric layer;
   a first metal layer disposed over and in direct contact with the conductive line, wherein an entirety of a bottommost surface of the metal layer directly contacts an entirety of a topmost surface of the conductive line;
   a second metal layer disposed over and in direct contact with the first metal layer; and
   a metallization layer disposed over the second metal layer such that a protruding segment of the second metal layer acts as an interface between the conductive line and the metallization layer.

10. The semiconductor device of claim 9, wherein the conductive line is copper (Cu), the first the metal layer is cobalt (Co), and the second metal layer is ruthenium (Ru).

11. The semiconductor device of claim 9, wherein the second metal layer includes an upper metal layer section and a lower metal layer section.

12. The semiconductor device of claim 11, wherein the upper metal layer section prevents via-to-line delamination.

13. The semiconductor device of claim 11, wherein a collective height of the conductive line, the first metal layer, and the lower metal layer section of the second metal layer is greater than 1.5 µm.

14. The semiconductor device of claim 9, wherein a thickness of the conductive line is less than a thickness of a conductive material in the metallization layer.

15. A method comprising:
    forming a conductive line within a dielectric layer;
    constructing a first metal layer over and in direct contact with the conductive line, wherein an entirety of a bottommost surface of the first metal layer directly contacts an entirety of a topmost surface of the conductive line;
    constructing a second metal layer over and in direct contact with the first metal layer; and
    forming a metallization layer over the second metal layer such that a protruding segment of the second metal layer acts as an interface between the conductive line and the metallization layer.

16. The method of claim 15, wherein the conductive line is copper (Cu), the first the metal layer is cobalt (Co), and the second metal layer is ruthenium (Ru).

17. The method of claim 15, wherein the second metal layer includes an upper metal layer section and a lower metal layer section.

18. The method of claim 17, wherein the upper metal layer section prevents via-to-line delamination.

19. The method of claim 17, wherein a collective height of the conductive line, the first metal layer, and the lower metal layer section of the second metal layer is greater than 1.5 µm.

* * * * *